United States Patent [19]
Katsui

[11] Patent Number: 5,994,972
[45] Date of Patent: Nov. 30, 1999

[54] EMITTER-COUPLED MULTIVIBRATOR HAVING FREQUENCY PROPORTIONAL TO CONTROL VOLTAGE

[75] Inventor: Noboru Katsui, Ichikawa, Japan

[73] Assignee: Fujitsu Limited, Kanagawa, Japan

[21] Appl. No.: 09/039,764

[22] Filed: Mar. 16, 1998

[30] Foreign Application Priority Data

Oct. 8, 1997 [JP] Japan ................................. 9-275661

[51] Int. Cl.⁶ .................................................. H03K 3/282
[52] U.S. Cl. .................. 331/113 R; 331/144; 331/177 R
[58] Field of Search ............................. 331/113 R, 144, 331/177 R

[56] References Cited

U.S. PATENT DOCUMENTS 5,357,220  10/1994  Francis ................................. 331/113 R Primary Examiner—Siegfried H. Grimm
Attorney, Agent, or Firm—Helfgott & Karas, P.C.

[57] ABSTRACT

An emitter-coupled multivibrator includes two transistors, a base potential supplying circuit for maintaining the base potential of one transistor which is on at a high potential and the base potential of the other transistor which is off at a low potential, and a base potential control circuit for controlling the base potential of the transistor which is on in accordance with a frequency controlling voltage $V_C$. A coupling capacitor is charged with a constant current which flows through the transistor which is on, and when the voltage between the base and the emitter of the transistor which is off reaches a predetermined value by charging, the transistor which is off is turned on, while the transistor which is on is turned off. The same operation is repeated so as to alternately turn on and off the transistors for the purpose of oscillating operation. At the same time, the base potential control circuit controls the base potential of the transistor which is on in accordance with the frequency controlling voltage $V_C$, thereby alternately turning on and off the transistors at a frequency $f_0$ which is proportional to the frequency controlling voltage $V_C$.

4 Claims, 11 Drawing Sheets

FIG.1
(a) IDEAL OPERATION
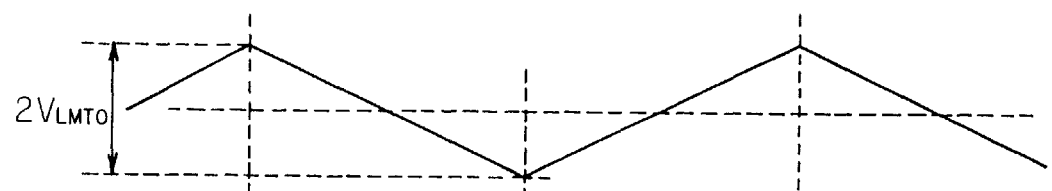
(b) OPERATION OF CONVENTIONAL CIRCUIT
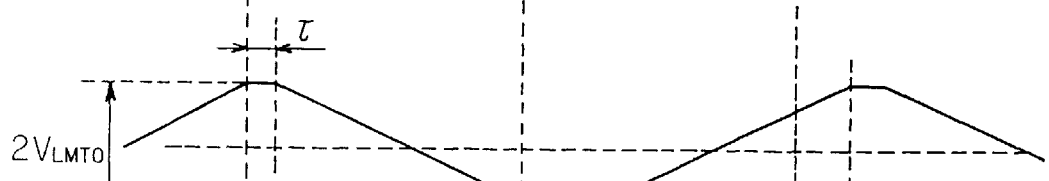
(c) OPERATION OF THE PRESENT INVENTION
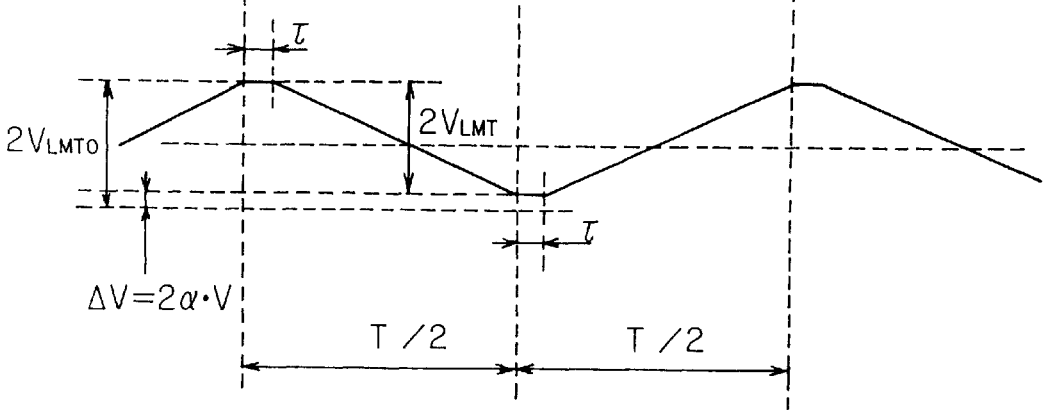

FIG.6 PRIOR ART
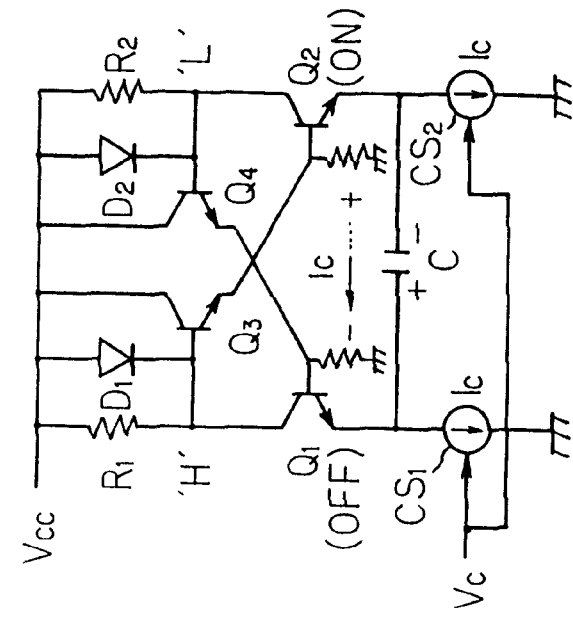
(a) STATE 1
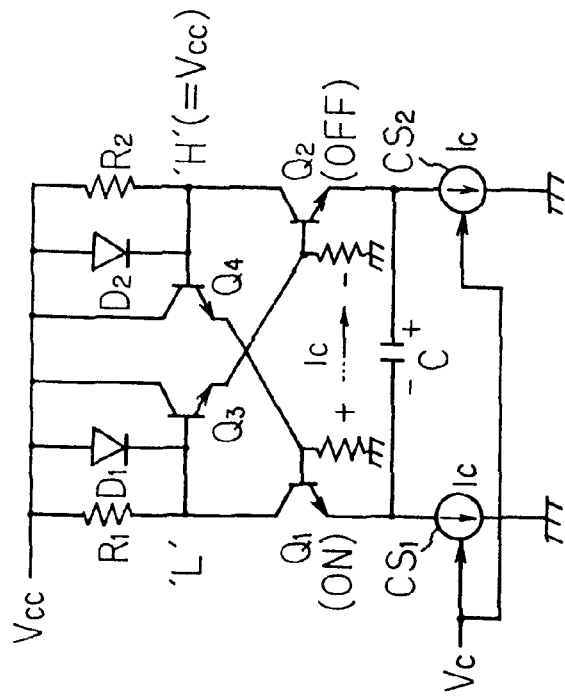
(b) STATE 2
$Ic = g_m \cdot V_c$ 5,994,972

EMITTER-COUPLED MULTIVIBRATOR HAVING FREQUENCY PROPORTIONAL TO CONTROL VOLTAGE

BACKGROUND OF THE INVENTION

The present invention relates to an emitter-coupled multivibrator and, more particularly, to an emitter-coupled multivibrator including two transistors which are alternately turned on and off and the emitters of which are connected with each other via a capacitor and are also connected to respective constant current sources.

In a field of directly modulating the frequency of a baseband signal such as a video signal which requires a wide frequency deviation, a frequency modulator is usually constituted by a circuit based on an emitter-coupled multivibrator, which is one of the relaxation oscillation system. FIG. 6 shows an example of the circuit of such an emitter-coupled multivibrator, and FIG. 7 shows the waveform of the operation of each element thereof.

In FIG. 6, the symbols $Q_1$, $Q_2$ represent NPN transistors which constitute a multivibrator and which are alternately turned on and off, C a capacitor for connecting the emitters of the transistors $Q_1$, $Q_2$, and $CS_1$, $CS_2$ constant current sources provided between the emitters of the respective transistors $Q_1$, $Q_2$ and the earth. A frequency controlling voltage $V_C$ is input to the each of the constant current sources $CS_1$, $CS_2$, which supply a constant current $I_C$ represented by the following equation:

$$I_C = gm \cdot V_C$$

wherein gm represents a mutual conductance. The collectors of the transistors $Q_1$ and $Q_2$ are connected to a bias supply $V_{CC}$ via resistors $R_1$, $R_2$ and diodes $D_1$, $D_2$, respectively. The diode $D_1$ ($D_2$) has a function of clamping the terminal voltage of the resistor $R_1$ ($R_2$) to a constant voltage $V_D$ when the transistor $Q_1$ ($Q_2$) is turned on even if a collector current changes.

The symbols $Q_3$, $Q_4$ represent NPN transistors for supplying a base current to the transistors $Q_1$ and $Q_2$. The emitter terminals of the transistors $Q_3$ and $Q_4$ are connected to the base terminals of the transistors $Q_2$ and $Q_1$, respectively, the collector terminals are connected to the bias supply $V_{CC}$, and the base terminals are connected to the collector terminal of the transistors $Q_1$ and $Q_2$, respectively.

If it is now assumed that the transistor $Q_1$ is on and the transistor $Q_2$ is off, as shown in FIG. 6(a), the emitter potential of the transistor $Q_1$ is $V_{CC} - 2V_{BE}$, wherein $V_{BE}$ is a voltage between the base and the emitter. Although the emitter potential of the transistor $Q_2$ is inferred to be $V_{CC} - V_D - 2V_{BE}$, the inter-base emitter voltage of the transistor $Q_2$, actually, cannot reach $V_{BE}$ which is necessary for turning on, because the emitter-coupled capacitor C is charged as shown in FIG. 6(a). Therefore, the transistor $Q_2$ is still off. In this state, if the constant current $I_C$ flows in the direction indicated by the arrow via the transistor $Q_1$ which is on, the charges stored in the coupling capacitor C are discharged, and the capacitor C is finally charged to the opposite polarity. If the charging state continues, the emitter potential of the transistor $Q_2$ is lowered and the inter-base emitter voltage has a satisfactory $V_{BE}$ which is sufficient for turning on the transistor $Q_2$, and a current begins to flow through the transistor $Q_2$, which is turned on.

When the transistor $Q_2$ is turned on, as shown in FIG. 6(b), a diode clipping voltage $V_D$ generates as a terminal voltage of the resistor $R_2$ which is connected to the collector terminal of the transistor $Q_1$ resulting in lowering the base potential of the transistor $Q_1$. But, the emitter potential of the transistor $Q_1$ cannot be lowered in accordance with the lowered base potential, because the capacitor C is charged in the polarity shown in FIG. 6(b), so that the transistor $Q_1$ is turned off. This is the operation in a half cycle.

The peak-to-peak amplitude of the rectangular wave of the collector voltage of each of the transistors $Q_1$ and $Q_2$ is the clamping voltage $V_{D(p-p)}$ of the diodes $D_1$ and $D_2$ respectively, and the emitter potential has an intermittent saw-tooth waveform. The amplitude thereof is $2V_{D(p-p)}$ with the charging voltage taken into consideration. Consequently, the time (T/2) elapsed before the emitter potential of the transistor $Q_1$ or $Q_2$ drops by $2V_D$ is represented by the following equation:

$$(1/C) \cdot \int I_C \, dt = 2V_D$$

$$t = T/2 = 2V_D C/I_C = 2V_D C/gm \cdot V_C \quad (1)$$

Therefore, the oscillation frequency $f_0$ is represented by $$f_0 = 1/T = (gm/4CV_D) \cdot V_C \quad (2)$$

In an actual diode, however, as is clear from the voltage-current characteristic of a diode, the clamping voltage ($V_D$) of the diode fluctuates slightly depending upon the current $I_C$, i.e., the frequency controlling voltage $V_C$. Consequently, the oscillation frequency $f_0$ is sometimes not proportional to $V_C$.

To solve this problem, a circuit has been proposed which is improved in that the amplitudes of the intermittent saw-tooth waves (amplitudes of the waveforms of the emitter potentials of the transistors $Q_1$ and $Q_2$) do not directly depend upon the clamping voltages VD of the diodes $D_1$ and $D_2$.

FIG. 8 shows the circuit of such an improved emitter-coupled multivibrator, and FIG. 9 shows the waveform of the operation of each element thereof. In FIG. 8, the same reference numerals are provided for the elements which are the same as those shown in FIG. 6. The emitter-coupled multivibrator shown in FIG. 8 is different from that shown in FIG. 6 in that a current switch CSW is provided. The current switch CSW is composed of a differential pair of amplifiers of the transistors $Q_3$, $Q_4$, a current source CS of a constant current I, and collector resistors $R_C$, etc.

When the transistor $Q_1$ is on, and the transistor $Q_2$ is off, the transistor $Q_3$ in the current switch SW is off and the transistor $Q_4$ is on. In this case, a limit voltage $V_{LMT}$ (=I·$R_C$) having a constant amplitude generates at the collector terminal of the transistor $Q_3$, and the limit voltage $V_{LMT}$ is input to the base terminal of the transistor $Q_1$ via the coupling capacitor. On the other hand, the voltage at the collector terminal of the transistor $Q_4$ is 0, and this voltage is input to the base terminal of the transistor $Q_2$.

In this state, a constant current I flows through the emitter coupling capacitor C in the direction indicated by the arrow so as to discharge the charges stored in the coupling capacitor C and then charge the capacitor C to the opposite polarity. If the charging state continues, the emitter potential of the transistor $Q_2$ is lowered and the inter-base emitter voltage has a satisfactory $V_{BE}$ which is sufficient for turning on the transistor $Q_2$, and a current begins to flow through the transistor $Q_2$, which is turned on. Then the base potential of the transistor $Q_3$ which constitutes the differential pair becomes higher than the base potential of the transistor $Q_4$, and the transistor $Q_3$ is turned on, while the transistor $Q_4$ is turned off. When the transistor $Q_3$ is turned on, the base potential of the transistor $Q_1$ is lowered to approximately zero. However, the emitter potential of the transistor $Q_1$ cannot be lowered in accordance with the lowered base potential, because the capacitor C is in the act of charging, so that the transistor $Q_1$ is turned off. This is the operation in a half cycle.

As described above, the transistor $Q_1$ is turned off and the transistor $Q_2$ is turned on, and the transistor $Q_3$ is turned on and the transistor $Q_4$ is turned off in the current switch CSW in the first half cycle. In addition, the limit voltage $V_{LMT}$ having a constant amplitude (=I·$R_C$) generates at the collector terminal of the transistor $Q_4$, and the limit voltage $V_{LMT}$ is input to the base terminal of the transistor $Q_2$ via the coupling capacitor. On the other hand, the voltage at the collector terminal of the transistor $Q_3$ is 0, and this voltage is input to the base terminal of the transistor $Q_1$. In this state, the same operation as that in the first half cycle is repeated in the second half cycle.

As is clear from the above explanation, the peak-to-peak amplitude of the rectangular wave of the collector voltage of each of the transistors $Q_1$ and $Q_2$ is the clamping voltage $V_{D(P-P)}$ of the diode $D_1$ ($D_2$), but the amplitude of the rectangular wave of the base of each of the transistors $Q_1$ and $Q_2$ is $V_{LMT}$. That is, the $V_C$ dependence of the amplitude of the rectangular wave of the base is removed by the limiter characteristic of the current switch CSW, and the amplitude becomes $V_{LMT}$. As a result, the emitter potential of each of the transistors $Q_1$ and $Q_2$ has an intermittent saw-tooth waveform and the amplitude thereof is $2V_{LMT}$ with the charging voltage taken into consideration. Consequently, the time (T/2) elapsed before the emitter potential of the transistor $Q_1$ or $Q_2$ drops by $2V_{LMT}$ is represented by the following equation:

$$T/2 = 2V_{LMT}C/I_C = 2V_{LMT}C/gm \cdot V_C \quad (3)$$

Therefore, the oscillation frequency $f_0$ is represented by $$f_0 = 1/T = (gm/4CV_{LMT}) \cdot V_C \quad (4)$$

In an emitter-coupled multivibrator improved in the above-described way, the $V_C$ dependence of the amplitude of the rectangular wave of the base is removed and, as a result, it is possible to make the oscillation frequency $f_0$ proportional to the frequency controlling voltage $V_C$. However, even in such an improved emitter-coupled multivibrator, the Vc-$f_0$ characteristic becomes nonlinear with an increase in the oscillation frequency $f_0$, as shown in FIG. 10. This is because the rising time in the intermittent saw-tooth waveform cannot be regarded as zero. More specifically, in a case where a high frequency oscillation generates, it is impossible to disregard the rising time in the intermittent saw-tooth waveform, as shown in FIG. 11. If it is assumed that the rising time is constantly τ, the half period takes longer by the time corresponding to the rising time τ. The relational expression for obtaining the half period is therefore corrected as follows:

$$T'/2 = 2(V_{LMT}C/gm \cdot V_C) + \tau \quad (5)$$

Therefore, the oscillation frequency $f_0$ is represented by $$f_0 = (1/T') = gm \cdot V_C/(4CV_{LMT} + 2\tau \cdot gm \cdot V_C) \quad (6)$$

At this time, the $V_C$ dependence generates in the denominator, and the $V_{C-f0}$ characteristic has a nonlinear characteristic as shown in FIG. 10.

SUMMARY OF THE INVENTION

Accordingly, it is an object of the present invention to solve the above-described problems in the related art to provide an emitter-coupled multivibrator which is capable of accurate oscillation at a frequency $f_0$ which is proportional to the frequency controlling voltage $V_C$ even if the frequency $f_0$ becomes high.

To accomplish this and other objects, in one aspect of the present invention, there is provided an emitter-coupled multivibrator including two transistors which are alternately turned on and off and the emitters of which are connected with each other via a capacitor and are also connected to respective constant current sources, the multivibrator comprising: a base potential supplying circuit for maintaining the base potential of the transistor which is on at a high potential and the base potential of the transistor which is off at a low potential; and a base potential control circuit for controlling the base potential of the transistor which is on in accordance with a frequency controlling voltage $V_C$. In the emitter-coupled multivibrator, the emitter-coupling capacitor is charged with a constant current which flows through the transistor which is on. When the capacitor is charged, the potential of the transistor which is off is lowered, and when the voltage between the base and the emitter reaches a predetermined value, the transistor which is off is turned on, while the transistor which is on is turned off. These transistors are thereafter alternately turned on and off, thereby executing the oscillating operation. At this time, with an increase of the frequency control voltage $V_C$, i.e., with an increase of the oscillation frequency $f_0$, the base potential control circuit lowers the potential input to the base terminal of a transistor which is on. In this manner, even if the oscillation frequency becomes too high to disregard the rising time, the rising time is compensated for, and the multivibrator can oscillate at a frequency $f_0$ which is proportional to the frequency controlling voltage $V_C$.

In an emitter-coupled multivibrator provided in another aspect of the present invention, the base potential supplying circuit is constituted by a current switch including (1) a differential pair of transistors the collectors of which are connected to the respective bases of the transistors constituting the multivibrator, and (2) a current source connected to the emitters of the differential pair, and the base potential control circuit controls the base potential of the transistor which is on by varying the current value of the current source of the current switch in accordance with the frequency controlling voltage $V_C$. In this manner, it is possible to oscillate at a frequency which is proportional to the frequency controlling voltage $V_C$ by a simple circuit structure.

Other features and advantages of the present invention will be apparent from the following description taken in conjunction with the accompanying drawings.

BRIEF DESCRIPTION OF THE DRAWINGS

FIG. 1 shows waveforms for explaining the summary of the present invention in comparison with a conventional circuit;

FIG. 6 shows a basic circuit of a conventional emitter-coupled multivibrator;

DESCRIPTION OF THE PREFERRED EMBODIMENTS (A) Comparison between the ideal operation, the operation of the present invention and the operation of a conventional circuit FIG. 1(a) shows the waveform of a voltage signal between the emitters of two transistors which constitute an emitter-coupled multivibrator during an ideal operation. The waveform is a triangular shape having an amplitude of $2V_{LMT0}$. The multivibrator accurately oscillates at an oscillation frequency which is proportional to the frequency controlling voltage $V_C$, as represented by the equation (4). FIG. 1(b) shows the waveform of a voltage signal between the emitters of two transistors which constitute the conventional emitter-coupled multivibrator shown in FIG. 8. The waveform is a triangular shape having an amplitude of $2V_{LMT0}$ with the crest collapsed. The oscillation frequency becomes the frequency represented by the equation (6) by the influence of the rising time $\tau$. That is, this multivibrator cannot oscillate at an oscillation frequency which is proportional to the frequency controlling voltage $V_C$. FIG. 1(c) shows the waveform of a voltage signal between the emitters of two transistors which constitute an emitter-coupled multivibrator according to the present invention. Although the waveform is a triangular shape having an amplitude of $2V_{LMT0}$ with the crest collapsed, it can accurately oscillate at an oscillation frequency which is proportional to the frequency controlling voltage $V_C$.

(B) Oscillation frequency control in the present invention

In order to remove the nonlinearity, in other words, to establish the proportional relationship between the control voltage $V_C$ and the oscillation frequency $f_0$, it is necessary to control other parameters so that the denominator in the equation (6) is not dependent upon $V_C$. The parameter to easily control is $V_{LMT}$. The function $V_{LMT}(V_C)$ as a function of $V_C$ is introduced so that the denominator can satisfy the following equation:

$$4V_{LMT}(V_C) \cdot C + 2\tau \cdot gm \cdot V_C = \text{constant}$$

When both sides are differentiated by $V_C$, $$4C \cdot V_{LMT}'(V_C) + 2\tau \cdot gm = 0$$

When this is integrated, $$V_{LMT}(V_C) = -(\tau \cdot gm/2C) \cdot V_C + V_{LMT0} \quad (7)$$

wherein $V_{LMT0}$ is a limiter amplitude when $V_C=0$ and it is not dependent on $V_C$. In this manner, by the negative modulation based on the first term on the right side of the equation (7), namely by controlling $V_{LMT}(V_C)$ to satisfy the equation (7) it is possible to remove the $V_C$ dependence of the denominator.

To explain this qualitatively, since the period is prolonged by the intrinsic delay $\tau$, as shown in FIG. 1(c), the limiter amplitude is reduced by that degree so as to shorten the time elapsed until inversion, thereby making the oscillation frequency $f_0$ proportional to $V_C$ as a whole.

Figure 2:
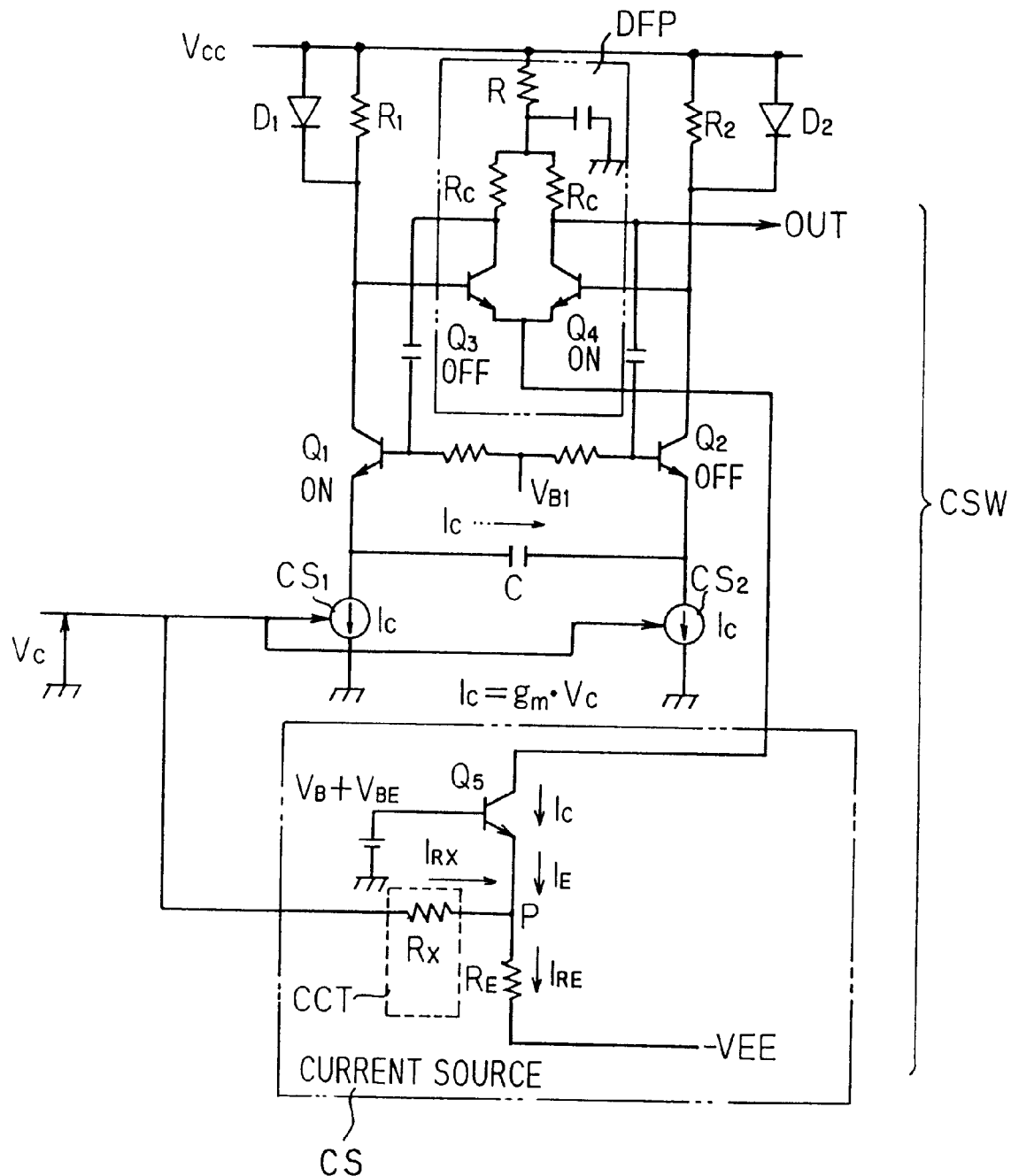
FIG. 2 shows a first embodiment of the present invention.

(C) First embodiment of an emitter-coupled multivibrator according to the present invention FIG. 2 shows the structure of a first embodiment of an emitter-coupled multivibrator according to the present invention. This embodiment is composed of an ordinary emitter-coupled multivibrator and a current switch CSW which is attached thereto.

The current switch CSW is provided with a differential pair DFP and a current source CS. The differential pair DFP is composed of transistors $Q_3$ and $Q_4$, collector resistors $R_C$, and the like. The emitters of the transistors $Q_3$ and $Q_4$ are coupled each other and connected to the current source CS, and the collectors of the transistors $Q_3$ and $Q_4$ are connected to each other via the collector resistors $R_C$ and connected to a bias power source $V_{CC}$. The base terminal of the transistor $Q_3$ is connected to the collector terminal of the transistor $Q_1$, and the base terminal of the transistor $Q_4$ is connected to the collector terminal of the transistor $Q_2$. The current source CS is provided with an NPN transistor $Q_5$, a resistor $R_E$ provided between the emitter terminal of the transistor $Q_5$ and a bias power source $V_{EE}$, a direct voltage source for supplying a constant voltage $V_B+V_{BE}$ ($V_B \geq 0$, i.e., $V_B=0$ in FIG. 2 and $V_{BE}$ is an interbase/emitter voltage of the transistor $Q_5$ when it is in "on" state) to the base terminal of the transistor $Q_5$, and a current varying portion CCT for varying the current value of the emitter current $I_E$ by supplying the current of $I_{RX}$ to the resistor $R_E$ in accordance with the frequency control voltage $V_C$. The current varying portion CCT is provided with a resistor $R_X$ to which the frequency controlling voltage $V_C$ is applied and supplies the current $I_{RX}$ represented by the following equation to the resistor $R_E$:

$$I_{RX}=V_C/R_X$$

If it is assumed that the emitter current of the transistor $Q_5$ is $I_E$, the current flowing through the resistor $R_E$ is $I_{RE}$, and the current flowing through the resistor $R_X$ is $I_{RX}$, the following equation holds at the node P:

$$I_E+I_{RX}=I_{RE} \quad (8)$$

If $V_{BE}$ ($V_B=0$) is supplied to the base of the transistor $Q_5$, the emitter potential is not greatly influenced by the current and becomes 0 (V). In this state, the following equations hold:

$$I_{RX}=V_C/R_X, I_{RE}=V_{EE}/R_E \quad (9)$$

The current $I_E$ ($\approx I_C$) flowing through the transistor $Q_5$ is finally represented by the following equation:

$$I_C \approx I_E = I_{RE} - I_{RX} = (V_{EE}/R_E) - (V_C/R_X) \quad (10)$$

As a result, the limiter amplitude $V_{LMT}(V_C)$ is $$V_{LMT}(V_C)=I_E \cdot R_C = \{(V_{EE}/R_E)-(V_C/R_X)\} \cdot R_C = (R_C/R_E) \cdot V_{EE} - (R_C/R_X)V_C \quad (11)$$

so that the negative modulation based on the second term on the right side is possible.

If $V_B \neq 0$, the emitter potential is $V_B(V)$, and
$I_{RX}=(V_C-V_B)/R_X$, $I_{RE}=(V_B+V_{EE})/R_E$.

If the equation (7) is compared with the equation (11), when the followings are satisfied;

$$R_C/R_X=\tau \cdot gm/2C \quad (12)$$

$$R_C \cdot V_{EE}/R_E=V_{LMT0} \quad (13),$$

the $V_{LMT}(V_C)$ based on the equation (7) completely coincides with $V_{LMT}(V_C)$ based on the equation (11). That is, the substantial condition for removing the nonlinear portion and making the oscillation frequency $f_0$ proportional to the frequency controlling voltage $V_C$ is only the equation (12).

From the foregoing, in the first embodiment of FIG. 2, the limiter amplitude $V_{LMT0}$ is determined to be $R_C \cdot V_{EE}/R_E$, and the value of the resistor $R_X$ is determined to satisfy the following equation $$R_X = 2C \cdot R_C / \tau \cdot gm \quad (14).$$

In this manner, even if the oscillation frequency becomes too high to disregard the rising time $\tau$, it is possible to shorten the time elapsed until the inversion by suppressing the limiter amplitude by the value corresponding to $\tau$. Thereby, it is possible to make the oscillation frequency $f_0$ proportional to the frequency controlling voltage $V_C$.

When the transistor $Q_1$ is on and the transistor $Q_2$ is off, the transistor $Q_3$ on the current switch CSW is off and the transistor $Q_4$ is on. In such a case, the limit voltage $V_{LMT}(V_C)$ represented by the equation (11) generates at the collector terminal of the transistor $Q_3$, and the limit voltage $V_{LMT}(V_C)$ is input to the base terminal of the transistor $Q_1$ via the coupling capacitor. On the other hand, the voltage at the collector terminal of the transistor $Q_4$ is 0, and it is input to the base terminal of the transistor $Q_2$.

In this state, the constant current $I_C$ flows through the coupling capacitor in the direction indicated by the arrow, and the charges stored in the coupling capacitor C are discharged, and the capacitor C is finally charged to the opposite polarity. If the charging state continues, the emitter potential of the transistor $Q_2$ is lowered and the inter-base emitter voltage has a satisfactory $V_{BE}$ which is sufficient for turning on the transistor $Q_2$, and a current begins to flow through the transistor $Q_2$, which is turned on. Then the base potential of the transistor $Q_3$ which constitutes the differential pair becomes higher than the base potential of the transistor $Q_4$, and the transistor $Q_3$ is turned on, while the transistor $Q_4$ is turned off. When the transistor $Q_3$ is turned on, the base potential of the transistor $Q_1$ is lowered to approximately zero. However, the emitter potential of the transistor $Q_1$ cannot be lowered in accordance with the lowered base potential, because the capacitor C is in the act of charging, so that the transistor $Q_1$ is turned off. This is the operation in a half cycle.

In the first half cycle, the transistor $Q_1$ is turned off, the transistor $Q_2$ is turned on, the transistor $Q_3$ in the current switch CSW is turned on, and the transistor $Q_4$ is turned off. The limit voltage $V_{LMT}(V_C)$ represented by the equation (11) generates at the collector terminal of the transistor $Q_4$, and the limit voltage $V_{LMT}(V_C)$ is input to the base terminal of the transistor $Q_2$ via the coupling capacitor. On the other hand, the voltage at the collector terminal of the transistor $Q_3$ is 0, and it is input to the base terminal of the transistor $Q_1$. Thereafter, in this state, the same operation as that in the first half cycle is repeated in the second half cycle.

Consequently, the oscillation frequency $f_0$ is $$f_0 = gm \cdot V_C / 4C \cdot V_{LMT0} \quad (15)$$

It is thus possible to make the oscillation frequency $f_0$ proportional to the frequency controlling voltage $V_C$.

(D) Second embodiment of an emitter-coupled multivibrator according to the present invention In the first embodiment of an emitter-coupled multivibrator, when the emitter potential of the transistor $Q_5$ for the current source cannot be maintained at 0(V) by the influence of the temperature or the $I_E$ itself, the oscillation frequency $f_0$ cannot satisfy the equation (15). In order to solve such a problem, it is necessary to make the emitter potential of the transistor $Q_5$ constant (=0 volt) irrespective of the temperature, the $I_E$ and $V_C$. In order to realize the request, in a second embodiment the emitter potential of the transistor $Q_5$ is constantly maintained at 0(V) by feedback control using an operation amplifier.

Figure 3:
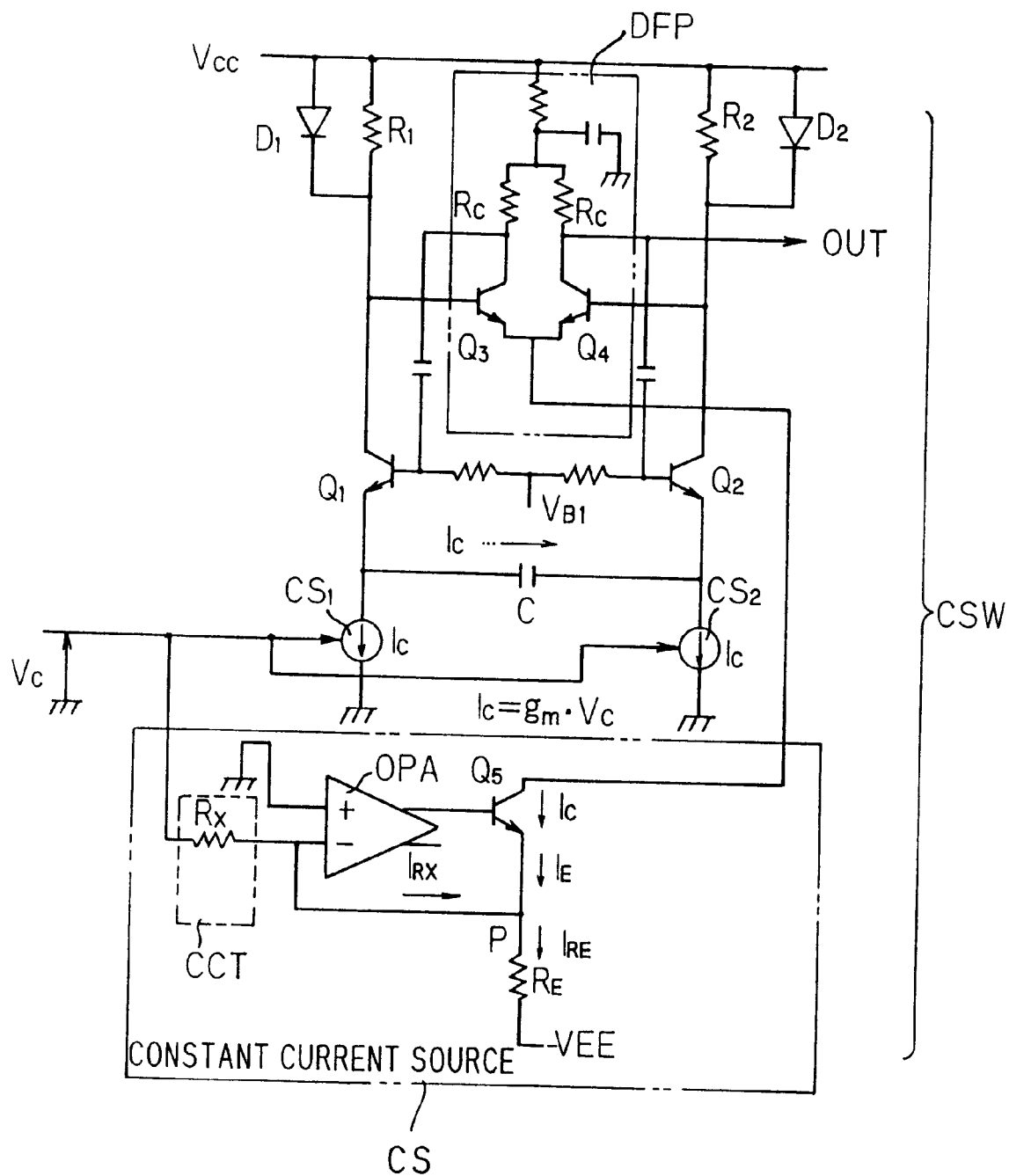
FIG. 3 shows a second embodiment of the present invention.

FIG. 3 shows the structure of a second embodiment of an emitter-coupled multivibrator according to the present invention. The same reference numerals are provided for the elements which are the same as those in the first embodiment shown in FIG. 2. The symbol OPA represents an operational amplifier for constituting a power source of $+V_{BE}$. A grounding voltage is input to the non-inverting input terminal of the operational amplifier OPA and the frequency controlling voltage $V_C$ is input to the inverting input terminal of the operational amplifier OPA via the resistor $R_X$. The output terminal of the operational amplifier OPA is connected to the base terminal of the transistor $Q_5$ for the constant current source CS, and the emitter voltage of the transistor $Q_5$ is fed back to the inverting terminal of the operational amplifier OPA.

According to this feedback structure, the emitter potential of the transistor $Q_5$ is controlled at 0(V), so that it is possible to make the oscillation $f_0$ proportional to the frequency controlling voltage $V_C$ irrespective of the temperature, $I_E$ or the like.

Figure 4:
FIG. 4 shows waveforms for explaining the process for removing the intensity modulation component caused by negative modulation.

When the negative modification is executed on the limiter amplitude by $V_C$, as described above, the intensity modulation component appears in the output OUT (waveform of $R_C$), as shown in FIG. 4. However, by adding a limiter or a buffer on the next stage, it is possible to remove the intensity modification component.

Figure 5:
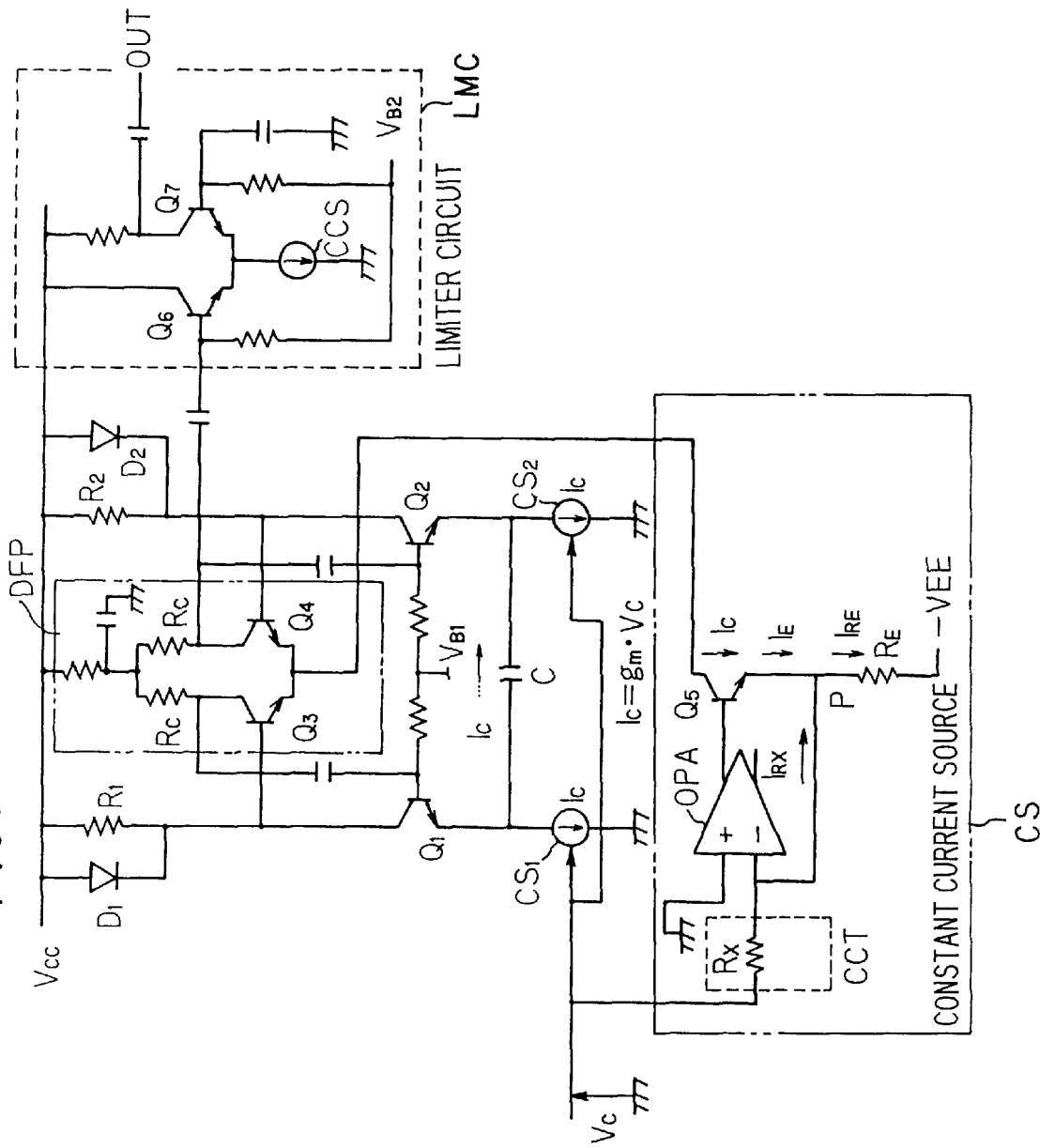
FIG. 5 shows a structure for removing the intensity modulation component.
Figure 7:
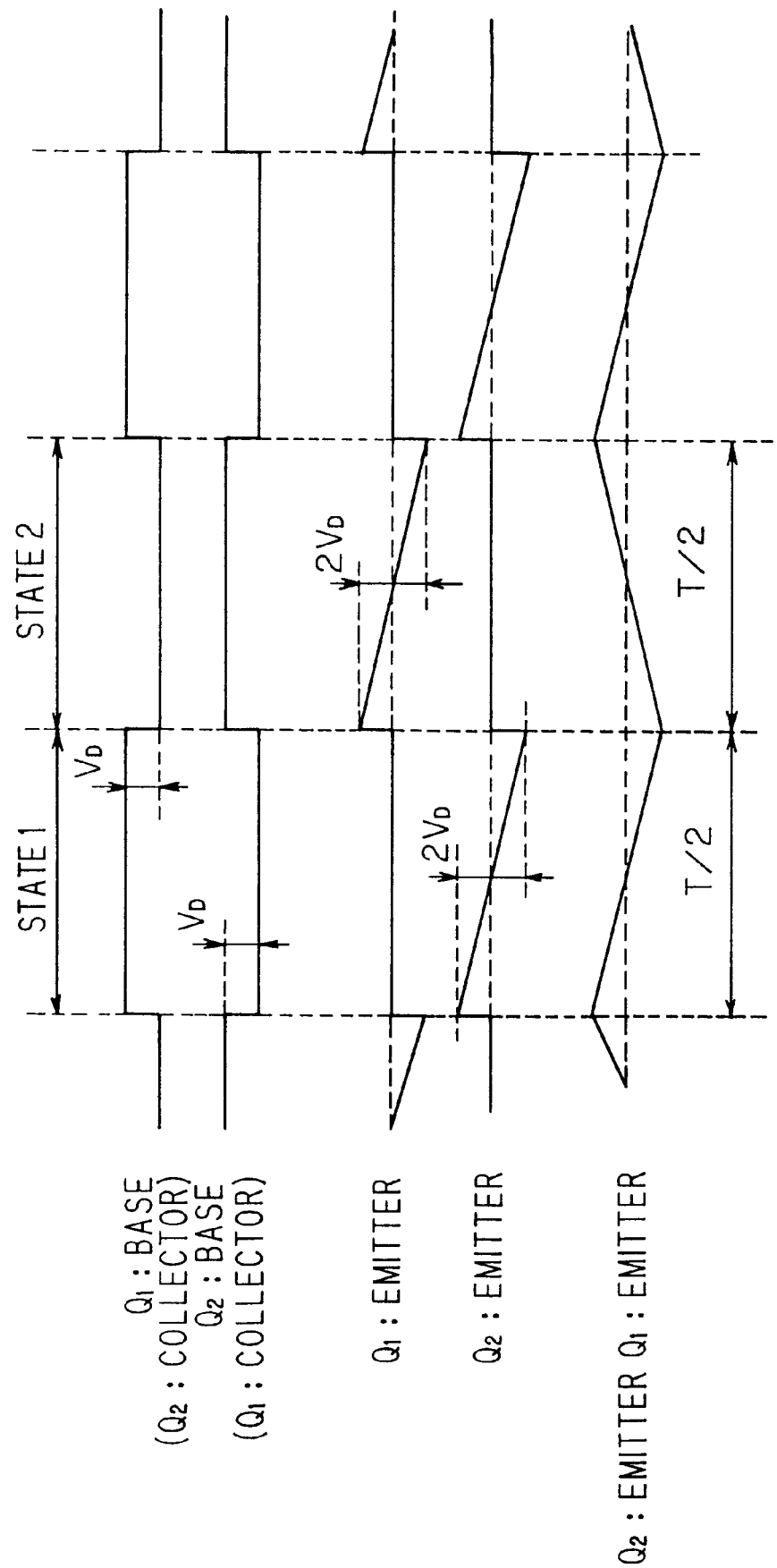
FIG. 7 shows the timing and the waveform of operation of each element for explaining the basic circuit.
Figure 8:
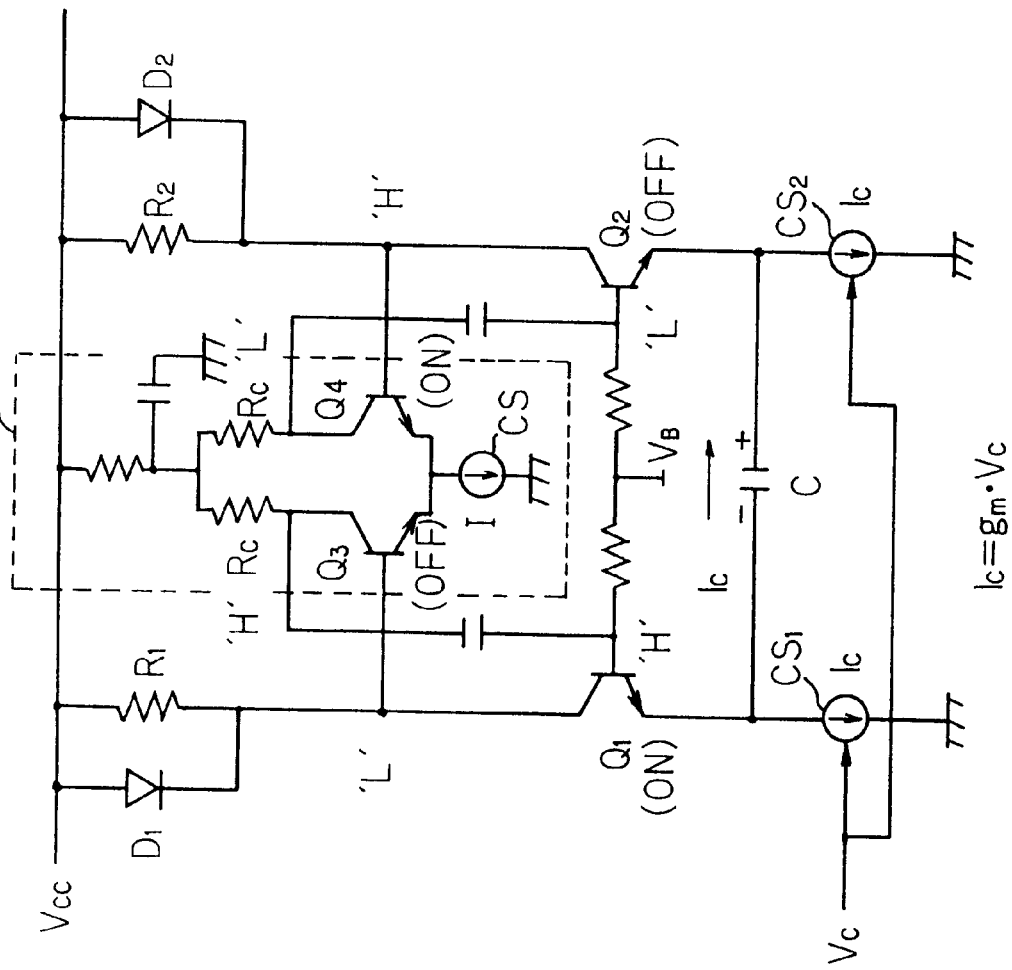
FIG. 8 shows an improved circuit of a conventional emitter-coupled multivibrator.
Figure 9:
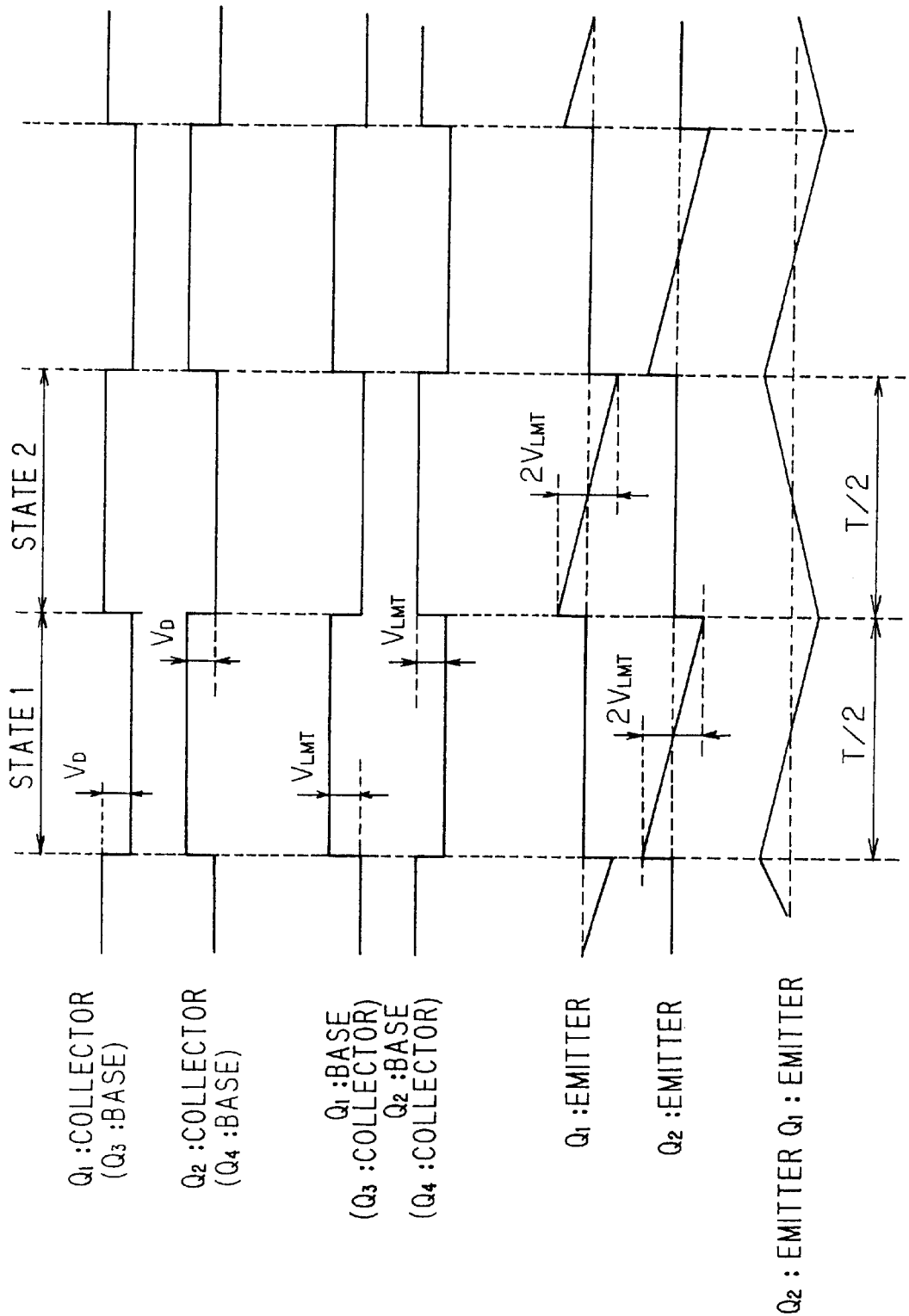
FIG. 9 shows the timing and the waveform of operation of each element in the improved circuit shown in FIG. 8.
Figure 10:
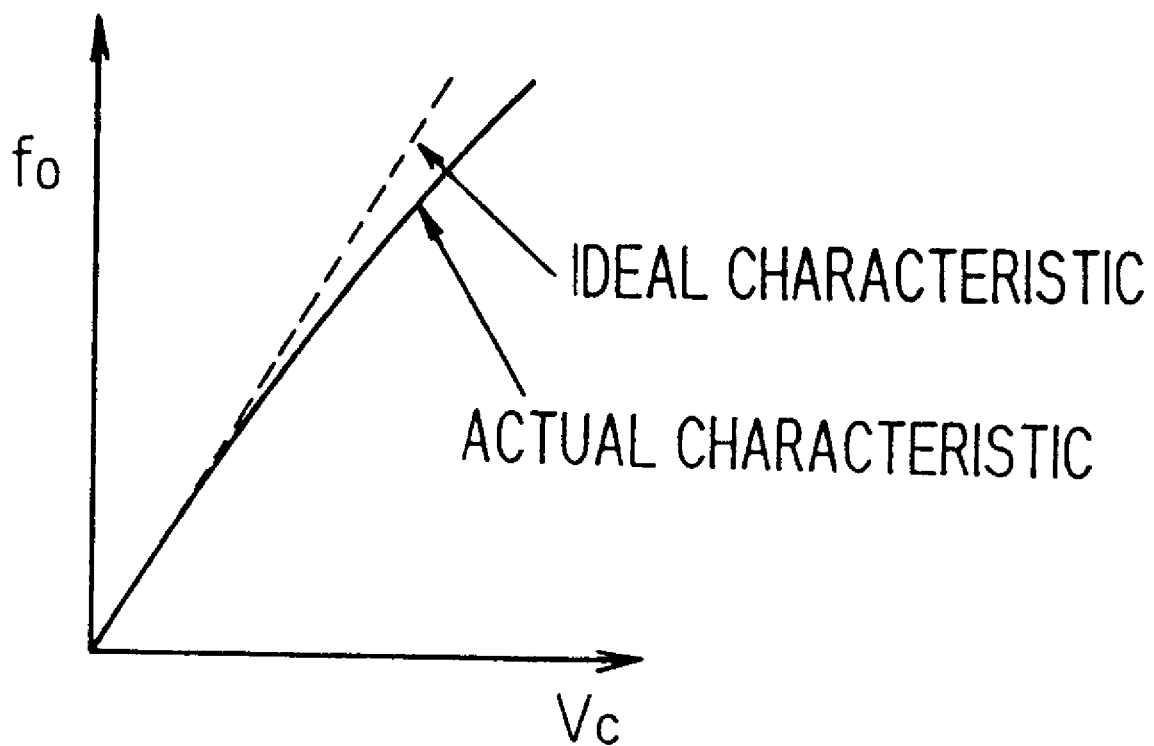
FIG. 10 shows the $V_C$-$f_0$ characteristic.
Figure 11:
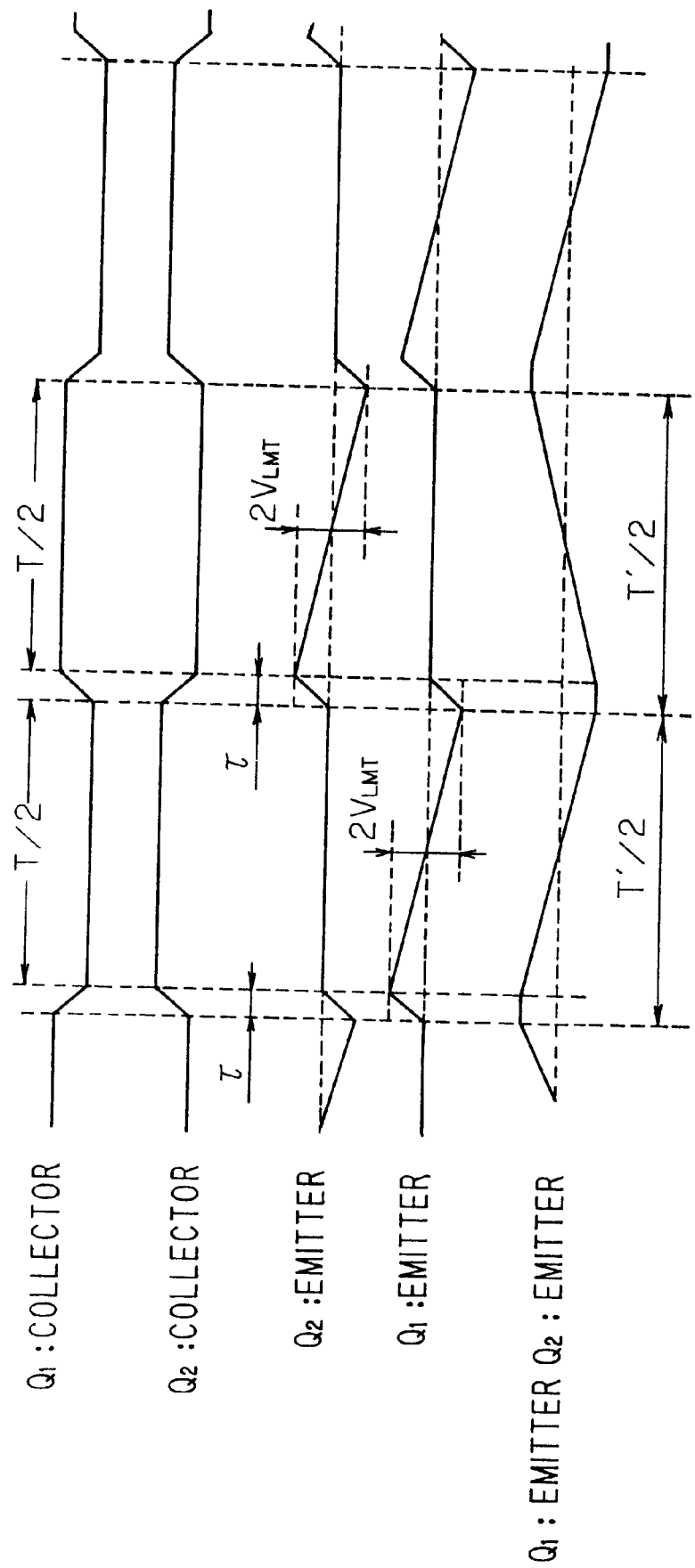
FIG. 11 shows the timing and the waveform of operation of each element in the improved circuit at the time of a high frequency oscillation.

FIG. 5 shows an example of a structure in which a limiter LMC is connected to the output side of the second embodiment. The limiter LMC is provided with a differential pair of the transistors $Q_6$, $Q_7$ and a constant current source CCS. When an output signal of a higher level is input from the multivibrator to the transistor $Q_6$ of the limiter LMC, the transistor $Q_7$ is turned off and the limiter LMC supplies an output of a high level. On the other hand, when an output of a low level is input to the transistor $Q_6$, the transistor $Q_7$ is turned on, and the limiter LMC supplies an output of a low level.

As described above, according to the present invention, since the base potential of the transistor of a multivibrator which is on is controlled by the base potential control circuit in accordance with the frequency controlling voltage $V_C$, the multivibrator accurately oscillates at a frequency proportional to the frequency controlling voltage $V_C$ even if the oscillation frequency becomes high. In other words, according to the present invention, it is possible to effectively compensate for the nonlinearity of a VCO (voltage controlled oscillator) which begins to appear at a high frequency, thereby producing a frequency modulation characteristic having a very good linearity. Consequently, the present invention is favorably applied to a frequency modulator for directly modulating the frequency of a baseband signal such as a video signal which requires a wide frequency shift.

In the present invention, the base potential supplying circuit is constituted by a current switch including (1) a differential pair of transistors the collectors of which are connected to the respective bases of the transistors constituting the multivibrator, and (2) a current source connected to the emitters of the differential pair. The base potential supplying circuit controls base potential of the transistor which is on by varying the current value of the current source of the current switch in accordance with the frequency controlling voltage $V_C$. According to the present invention having this structure, the multivibrator can accurately oscillate at the frequency which is proportional to the frequency controlling voltage $V_C$ by a simple circuit structure even if the oscillation frequency becomes high.

In addition, in the present invention, the current source of the current switch is composed of the transistor $Q_5$ and the resistor $R_E$, the collector of the transistor is connected to the emitter terminals of the differential pair, and the emitter of the transistor is connected to a predetermined bias-$V_{EE}$ via the resistor $R_E$ so that a constant emitter current $I_E$ of $V_{EE}/R_E$ may flow. The base potential control circuit supplies the current $I_{RX}$ which corresponds to the frequency controlling voltage $V_C$ to the resistor $R_E$, so that the emitter current $I_E$ of the transistor reduces, thereby varying the current value of the current source of the current switch. In this manner, it is possible to accurately oscillate at a frequency proportional to the frequency controlling voltage $V_C$ by a simple structure by controlling the base potential of the transistor of the multivibrator which is on.

In this case, the voltage source of $+V_{BE}$ is composed of an operational amplifier, a grounding voltage is input to the input terminal of the operational amplifier, the output terminal is connected to the base of the transistor and the emitter voltage of the transistor is fed back to the other input terminal. In this manner, it is possible to make the emitter potential of the transistor for the constant current source constantly 0 V irrespective of the temperature, the emitter current or the like, thereby accurately oscillating at a frequency proportional to the frequency controlling voltage $V_C$.

As many apparently widely different embodiments of the present invention can be made without departing from the spirit and scope thereof, it is to be understood that the invention is not limited to the specific embodiments thereof except as defined in the appended claims.

What is claimed is:

1. An emitter-coupled multivibrator including two transistors which are alternately turned on and off and the emitters of which are connected with each other via a capacitor and are also connected to respective constant current sources each of which supplies a constant current $I_C$ the value of which is decided by a frequency controlling voltage $V_C$, said multivibrator comprising:

a base potential supplying circuit for maintaining the base potential of one of said transistors which is on at a high potential and the base potential of the other of said transistors which is off at a low potential; and a base potential control circuit for controlling the base potential of said transistor which is on in accordance with said frequency controlling voltage $V_C$, wherein said capacitor is charged with said constant current $I_C$ which flows through said transistor which is on, and when the voltage between the base and the emitter of said transistor which is off reaches a predetermined value, said transistor which is off is turned on, while said transistor which is on is turned off, thereafter the same operation is repeated so as to alternatively turn on and off said transistors; and said base potential control circuit controls the base potential of said transistor which is on in accordance with said frequency controlling voltage $V_C$, thereby alternately turning on and off said transistors at a frequency $f_0$ which is proportional to said frequency controlling voltage $V_C$.

2. An emitter-coupled multivibrator according to claim 1, wherein said base potential supplying circuit is a current switch including a differential pair of transistors the collectors of which are connected to the base of each of said transistors constituting said multivibrator, and a current source connected to the emitters of said differential pair; and said base potential control circuit controls said base potential of said transistor which is on by varying the current value of said current source of said current switch in accordance with said frequency controlling voltage $V_C$.

3. An emitter-coupled multivibrator according to claim 2, wherein said current source of said current switch includes a transistor and a resistor $R_E$, the collector of said transistor is connected to said emitter terminals of said differential pair, the emitter of said transistor is connected to a predetermined bias voltage source $-V_{EE}$ via said resistor $R_E$, and the base of said transistor is connected to a constant voltage source $V_B+V_{BE}$ ($V_B \geq 0$, $V_{BE}$ is equal to a voltage between the base and the emitter of said transistor) so that a constant emitter current $I_E$ represented by $(V_B+V_{EE})/R_E$ flows through the emitter of the transistor; and said base potential control circuit supplies a current $I_{RX}$ in accordance with said frequency controlling voltage $V_C$ to said resistor $R_E$ so as to reduce said emitter current $I_E$ of said transistor, thereby varying said current value of said current source of said current switch in accordance with said frequency controlling voltage $V_C$.

4. An emitter-coupled multivibrator according to claim 3, wherein said voltage source of $+V_{BE}$ is constituted by an operational amplifier, when $V_B=0$;

the grounding voltage is input to one input terminal of said operational amplifier;

the output terminal of said operational amplifier is connected to the base of said transistor; and the emitter voltage of said transistor is fed back to another input terminal of said operational amplifier.

* * * * *